United States Patent [19]
Bishop et al.

[11] Patent Number: 4,720,675
[45] Date of Patent: Jan. 19, 1988

[54] METER LOCKING SYSTEM

[76] Inventors: Royston G. Bishop, 31 Donlea Dr., Port Colborne, Ontario, Canada, L3K 4W8; William Kirby, R. R. No. 1, Alliston, Ontario, Canada, L0M 1A0

[21] Appl. No.: 659,896

[22] Filed: Oct. 12, 1984

[51] Int. Cl.[4] .................. G01R 11/24; G01R 1/04; E05B 47/02
[52] U.S. Cl. .................. 324/110; 292/144; 292/201
[58] Field of Search ............... 324/110, 116; 209/201; 346/14 MR; 361/369, 370, 371, 372; 339/37, 198 M; 340/825.31, 825.32; 292/201, 144

[56] References Cited

U.S. PATENT DOCUMENTS

| | | | |
|---|---|---|---|
| 1,583,608 | 5/1926 | Sauton | 324/110 |
| 3,334,276 | 8/1967 | Bateman et al. | 361/369 |
| 3,654,484 | 8/1970 | Jorgenson et al. | 361/369 |
| 3,813,119 | 5/1974 | Panici | 292/201 |
| 3,915,491 | 6/1974 | Montgomery | 292/201 |
| 3,921,207 | 11/1975 | Doby et al. | 346/14 MR |
| 4,030,071 | 6/1977 | Barker | 340/825.32 |
| 4,092,591 | 5/1978 | Lozowski | 324/110 |
| 4,240,030 | 12/1980 | Bateman et al. | 324/110 |
| 4,404,521 | 9/1983 | Fennell | 324/110 |
| 4,573,333 | 3/1986 | Choi | 292/201 |

Primary Examiner—Reinhard J. Eisenzopf
Assistant Examiner—W. Burns
Attorney, Agent, or Firm—Ridout & Maybee

[57] ABSTRACT

A remotely controlled locking device is provided for preventing unauthorized withdrawal of watt-hour meters from their sockets. The locking device is typically located beneath the base of the meter in the socket, and both the meter and socket can be of standard design. The device may be associated with apparatus to indicate withdrawal of the meter and to count interruptions of power to the meter, thereby providing further security against tampering.

8 Claims, 10 Drawing Figures

METER LOCKING SYSTEM

This invention relates to watt-hour meters of the type commonly used for the metering of electricity supplied to consumers.

The meters used for this purpose in Canada and the United States of America, in the case of conventional three wire service up to 200 amps, have become highly standardized at least in respect of certain basic parameters of the meter connections and the bases into which they are plugged. Unfortunately, features of this same standardization have resulted in rendering meters vulnerable to certain fraudulent techniques by consumers resulting in the reading of meters falling short of the electricity actually consumed and the theft of power from the supply utility.

The practice of the more prevalent of these techniques involves inter alia the temporary removal of the meter from its base. Once the installation has been restored to its original condition, tampering is difficult to prove or pin down to a particular person, even when the seals applied to discourage such tampering have been broken. It would therefore be desirable both to provide some readily applicable means for more positively preventing unauthorized removal of a meter from its base, and to indicate that such removal has actually taken place. A seal provides little in the way of positive prevention, nor does its breakage of itself provide any proof that a meter has actually been removed from its base.

U.S. Pat. No. 4,240,030, issued Dec. 16, 1980 to Bateman, described an electric utility meter in which the meter is clamped to its base by an external locking ring with an internal solenoid operated latch such that the ring can only be released by insertion of a special encoded card into a card reader incorporated in the meter. Whilst this provides a more positive means to prevent tampering with the meter, it is only readily applicable to a specially adapted meter, which is non-standard. It cannot be retrofitted to existing meter, nor even used with new meters which are to be installed on existing bases.

U.S. Pat. No. 4,331,915, issued to Fielden on May 25, 1982, discloses the use in a meter of means to detect whether jumper leads have been used to bypass the meter, thus reducing the proportion of current flowing through the latter. The detection system used is relatively sophisticated, and is most useful in detecting a form of power theft which is less prevalent in North America, where the typical meter installation does not permit such ready access to the conductors both entering and leaving the meter. However the device does include internal contacts to detect whether the meter housing has been opened, and a flag to indicate whether such opening has occurred.

An object of the present invention is to provide a meter locking system which can be made compatible with existing standards relating to watt-hour meters and meter bases, which can be retrofitted to existing meter installations, if necessary without opening the meter housing, and which can be supplemented with means to detect removal of the meter from its base in the event that the locking system itself is defeated by a would-be power thief.

According to the invention, there is provided a meter locking device for a watt-hour meter installation comprising a watt-hour meter having a cover and a base, and a socket for the watt-hour meter for receiving the meter base and having receptacles receiving contact blades protruding through the meter base, said locking device comprising a locking member secured to one of the cover, the base and the socket so as to be inaccessible from the exterior of the installation, a releasable latch member normally in locking engagement with the locking member secured to a second of the cover, the base and the socket so as to be accessible only from the interior of the installation, and means securing the remaining one of the cover, the base and socket to one of the first two, said means being accessible only from the interior of the installation, electrically operated actuator means housed within the installation for releasing said latch member from locking engagement, and remote control means for energizing said actuating means on command whereby to release said latch member from said locking member and permit access to the interior of the installation.

Further features of the invention will become apparent from the following description of preferred embodiments thereof with reference to the accompanying drawings, in which.

Figure 1:
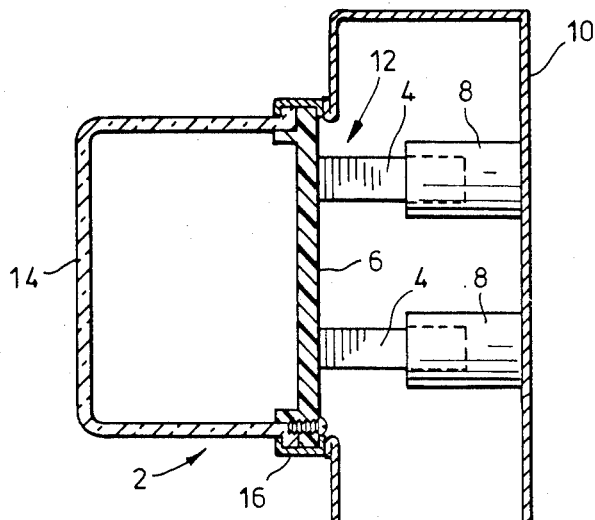
FIG. 1 is a simplified vertical cross section through a typical watt-hour meter installation, illustrating the environment in which the invention is incorporated.

Referring first to FIG. 1, a typical watt-hour meter installation comprises a meter 2, having contact blades 4 projecting through a base 6 so as to enter receptacles 8 mounted in a socket 10. Since the socket 10 is normally provided by a customer, and the meter 2 by a utility, it is necessary for the two to have certain standardized features to ensure plug compatibility. These features include the location and dimensions of the blades and receptacles, the diameter and location relative to the receptacles of an opening 12 in the socket, and certain dimensions of those portions of the base 6 which interengage with the opening 12. The operative parts of the meter (not shown) are mounted in front of the base 6, and enclosed by a transparent cover 14 which is normally locked to the base by rotation of a locking ring 16. The ring cannot be rotated to release the cover with removing a screw to which a seal can be applied as a precaution against tampering with the calibration of the meter.

Normally the seal would be applied by the manufacturer and broken only for authorized servicing and recalibration of the meter. In embodiments of the invention which are to be applied to existing meters, it is desirable that such application does not necessitate the breaking of this seal, i.e. that no access to the interior of the meter is required. However, this limitation does not apply to meters which are manufactured so as to incorporate features of the invention, or in the case where persons installing the invention have legitimate access to the interior of the meter. Whilst the embodiments of the invention described below are primarily intended for installation without opening the meter, a modification of one embodiment for installation within the meter is described and it should be understood that other embodiments may be modified along similar lines provided that adequate space is available within the meter casing.

The meter mechanism has not been illustrated since it does not form part of the invention and its function is independent of that of the invention, except to the extent that some of the more recent meter designs incorporating electronic processing of meter data may have facilities which can be utilized, programmed or adapted to carry out certain of the signal processing functions associated with the present invention and discussed further below.

The mechanical functions of the invention are essentially concerned with preventing unauthorized separation of three components which maintain the integrity against tampering of a typical watt-hour meter installation, namely the meter base and cover, and the meter socket. This is achieved by securing two of these components together by means only accessible when the third component is separated, and locking the third component to one of the other two by remotely controlled means inaccessible from the exterior of the installation. Normally speaking, the first two components will be the meter base 6 and cover 14, the cover being only releasable from the base when the meter is removed from the socket 10, and the locking means will be located beneath the base within the socket and act to lock these two components together. Alternatively however, the locking means may act to secure the cover to the base, permitting removal of the cover when unlocked without removal of the meter from the base. In this case, the base 6 is secured to the socket 10 by releasable means accessible once the cover 14 is removed. As a further alternative, the locking means may act directly between the cover and the socket, passing through an aperture in the base.

Figure 2:
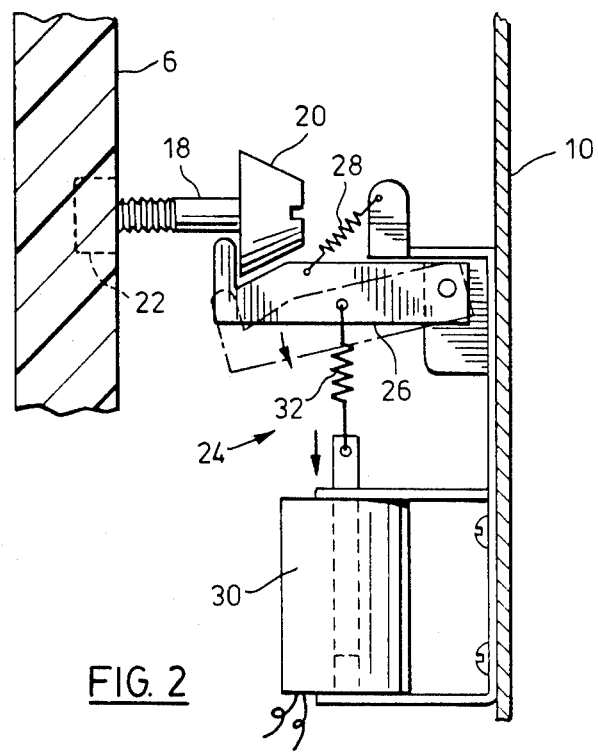
FIG. 2 is a fragmentary view illustrating features of a first embodiment of the invention.

Various forms of locking arrangement are illustrated in FIGS. 2–8. Referring to FIG. 2, portions of the meter base 6, and of the bottom of the socket 10 are shown. A locking member 18 in the form of a threaded stud with an enlarged head 20 is threaded into a socket 22 bonded to the base 6. It will be understood that various means may be used to secure the stud to the base 6, although some means which can be used without requiring access to the interior of the meter will often be preferred for reasons already discussed. Rather than the stud being threaded into the socket 22, the head 20 may be threaded onto the stud so as to provide a measure of adjustment of the spacing between the base 6 and the bottom of the socket 20. This is to accommodate variations between different models of meter and socket since the spacing is not fully standardized.

A solenoid operated latch unit 24 is secured by any suitable means, typically screws or rivets, to the bottom of the meter socket 10, and comprises a pivoting latch member 26 normally biased by a spring 28 into locking engagement with the head 20 of the locking member 18. The head 20 is coned so that it displaces the latch member 26 as the meter is pressed into the socket 10, and the latch is biased into a locking position by the spring as the meter reaches its fully inserted position, the position of the head having previously been adjusted to obtain correct locking. Once locked, the meter cannot be withdrawn unless the latch member 26 is withdrawn from engagement with the head 20 by a solenoid 30 whose plunger acts on the latch through a spring 32. This solenoid is remotely controlled as described further below.

Figure 3:
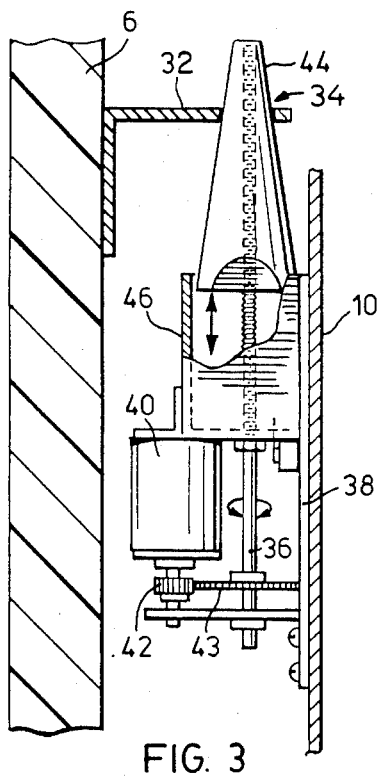
FIG. 3 is a fragmentary view illustrating features of a second embodiment of the invention.

Referring now to FIG. 3, a locking member 32 is bonded to the underside of the meter base, this member being in the form of a block with a cylindrical bore 34 having an axis parallel to the meter base. The block is located so that the axis of the bore lines up with the axis of a drive screw 36 supported by a bracket 38 secured to the bottom of the socket 10. The bracket also supports a small reversible electric motor 40 which drive the screw through reduction gears 42, 43. Carried by the screw is a conical latch member 44, guided and restrained against rotation by a base plate moving in a tubular passage formed by a part 46 of the bracket 38. The motor operates in one direction to drive the conical member 44 into the bore 34 in the locking member to lock the meter base into the socket, and in the opposite direction to withdraw the conical member from the bore and to release the meter.

Figure 4:
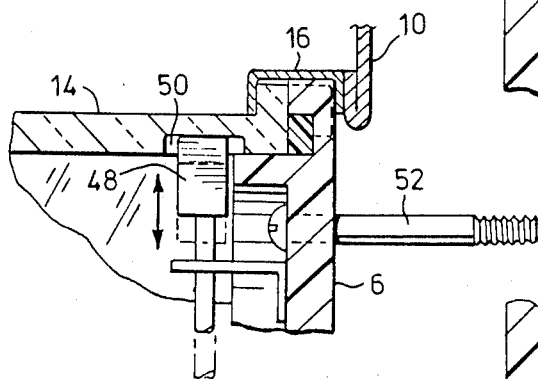
FIG. 4 is a fragmentary view illustrating features of a modification of the second embodiment in which the locking arrangement is located within the meter casing.

In a variation of this embodiment, shown in FIG. 4, the bracket 38 is mounted on the upper side of the meter base, and the conical member 44 is replaced by a wedge 48 which engages a recess 50 in the cover 14 and prevents it from being turned to a released position. The lock thus provided replaces the usual sealed screw (see FIG. 6) installed from beneath the base 6 to prevent removal of of the glass. Instead, a screw 52 is provided to secure the base 6 to the socket 10, this screw being accessible after removal of the cover 14.

Figure 5:
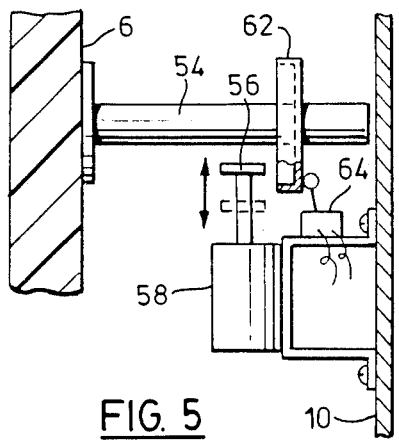
FIG. 5 is a fragmentary view illustrating features of a third embodiment of the invention.

Referring now to the embodiment diagrammatically shown in FIG. 5, a locking member in the form of a post 54 is secured to the base 6 of the meter so as to contact the bottom of the socket 10 when the meter is fully inserted. The plunger 56 of a solenoid 58 mounted in the socket 10 is normally extended by a spring 60 so as to overlap a disc 62 secured to the post 54, thus preventing withdrawal of the meter from the socket 10 unless the solenoid is energized so as to withdraw the plunger 56. The underside of the disc 62 engages the actuating stud of a microswitch 64 so that the switch will change state when the meter is withdrawn, thus providing a signal which may be processed as described further below.

Figure 6:
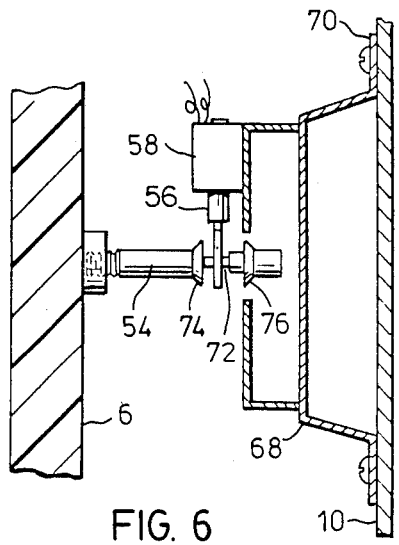
FIG. 6 is a fragmentary view illustrating features of a fourth embodiment of the invention.

FIG. 6 shows a development of this embodiment including more detail of the actual mountings to the meter components. The post 54 is screwed into a socket 66 bonded to the meter base 6, and the solenoid 58 is mounted on a sheet metal bracket 68 secured to or through the socket by mounting legs 70. The plunger 56 is forked at its distal end so as to engage a necked portion 72 of the post 54, further security against withdrawal of the latter being provided by coned projections 74 and 76, the lower of which displaces the plunger during insertion of the meter so that the solenoid does not have to be engaged to permit insertion.

Figure 7:
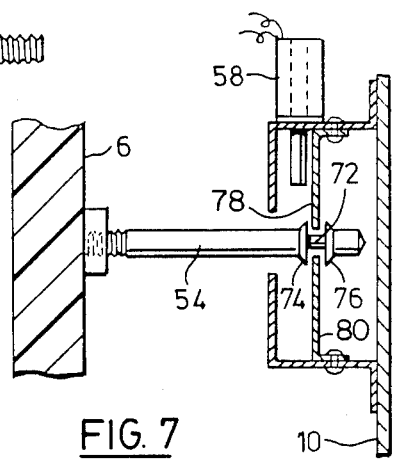
FIG. 7 is a fragmentary view illustrating features of a fifth embodiment of the invention.

In a further development shown in FIG. 7, the post 54 is similarly formed, but the neck 72 is engaged between two spring loaded flanges 78, 80 which deflect upwardly and downwardly to allow removal and insertion of the post. The solenoid plunger 56 when extended limits upward deflection of the flange 80 and prevent withdrawal of the post 58 and hence of the meter 2.

Figure 8:
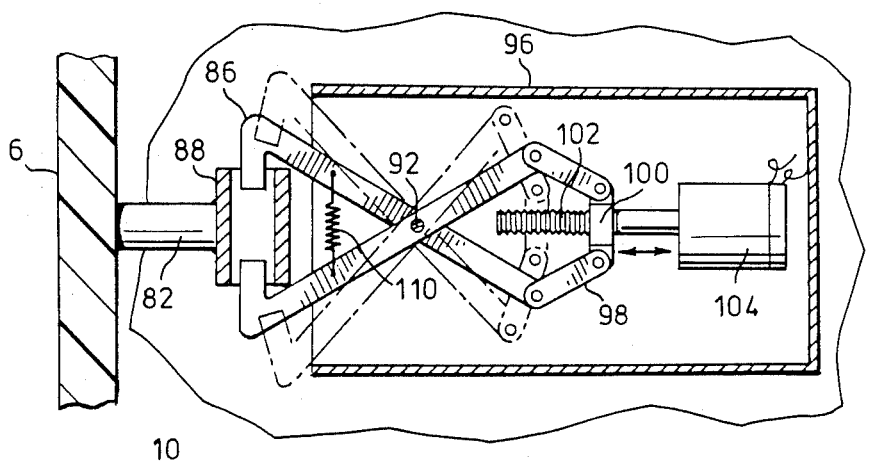
FIG. 8 is a fragmentary view illustrating features of a sixth embodiment of the invention.

In the arrangement shown schematically in FIG. 8, a post 82 is provided to the meter base 6, and carries an open ended laterally extending tubular member 88 at its lower end. Scissor-connected arms 84 and 86 are biased by a spring 110 so that inturned ends enter opposite ends of the tubular member 88, a pivot 92 connecting the arms being secured in a bracket 96 attached to the socket 10. The arms are moved between open and closed positions by links 98 connected to a nut 100 on a feed screw 102 driven by a motor 104. The motor is mounted to the bracket 96 within the socket. For convenience in illustration the base 6 and associated parts are shown turned through 90°.

It will be understood that numerous variations are possible upon the arrangements described above. For example, either solenoids or geared motors may be used in suitable cases, and the mountings of the latch member and the locking member to the meter base and the socket respectively may be reversed depending upon the space available, although mounting of the latch and its actuator in the socket will usually be more convenient.

Figure 9:
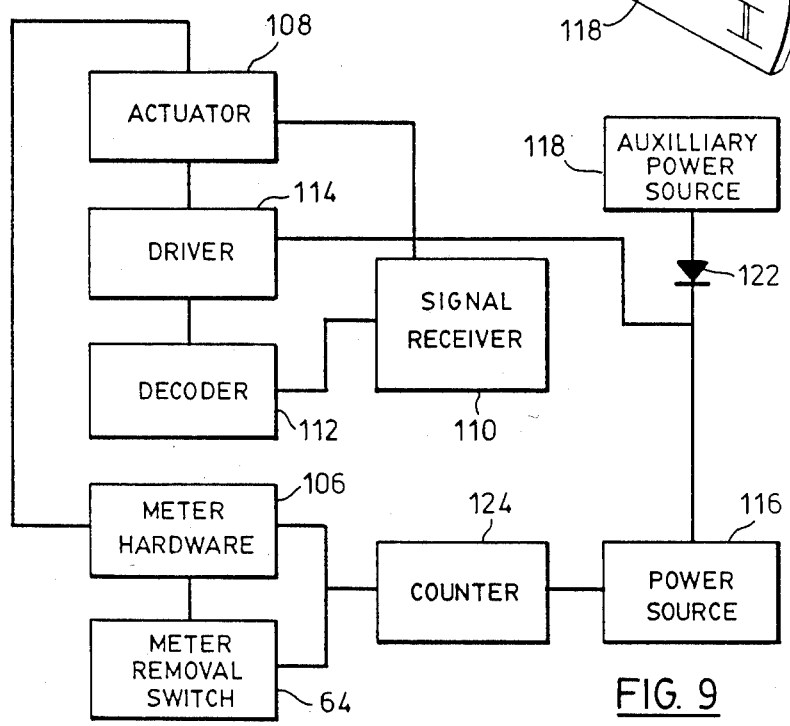
FIG. 9 is a block schematic diagram of electrical components of the system.

Referring now to FIG. 9, the locking and latch members so far described are designated by the block 106 designated "meter hardware", and the actuating solenoid or motor by the block 108 labelled "actuator". The actuator is controlled by remotely controlled means shown as comprising a signal receiver 110, receipt of a signal by which activates a decoder 112 and a driver circuit 114, the latter being activated to operate the actuator 108 responsive to the decoder receiving an appropriately coded signal or signals. The signal receiver 110 may be of various different types such as a radio receiver, an optical receiver, a receiver for signals modulated onto the power transmission lines feeding the meter or an ultrasonic receiver, any known and reliable technique for remotely transmitting signals to the circuitry within the meter installation being available. The decoder 112 may be such as to require receipt of two independently transmitted signals, for example a signal from a central office and a signal from a technician on the spot. Such an arrangement improves security by reducing the chances of the necessary coding transmitters becoming available to unauthorized purposes or being used for unauthorized purposes. Techniques for the transmission, reception and decoding of such coded signals are well known and need not be further described.

Figure 10:
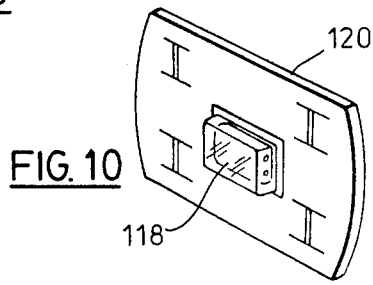
FIG. 10 shows an auxiliary power supply unit for use in conjunction with the invention.

Normally, the receiver and the actuator will be powered from the supply being metered through a suitable power supply circuit 116. There will however be occasions when it will be necessary to unlock and remove meters when the regular supply has been interrupted or cut off. For this reason, an auxiliary battery powered back-up supply is desirably provided. This may take the form shown in FIG. 10, in which a small dry battery 118, such as the widely used and compact 9 volt battery, is carried on a support 120 slipped over the contact blades 4 projecting from the rear of the meter. The auxiliary supply may be connected to the regular supply 116 through a normally reverse biased diode 122 so that it only becomes operative when the potential supply by the regular supply drops below a predetermined level.

As already described with reference to FIG. 5, a switch 64 may be provided to detect removal of the meter 2 from the socket 10. This switch may be connected to an electronic or electromechanical counter or indicator 124 which records or flags removals of the meter from its socket. Alternatively, the counter 124 counts interruptions of the regular power supply to the power source 116. Although such interruptions can and do occur for legitimate reasons, the number of interruptions recorded by a meter which it is suspected has been tampered with can be compared with the number of interruptions recorded over the same period by other meters in the immediate area which should have been subject to the same interruption pattern.

We claim:

1. A meter locking device for a watt-hour meter installation which comprises firstly a watt-hour meter having a transparent front cover, a base, operative components of the meter supported by the base within the cover, electrical contact blades protruding rearwardly through the base from the operative components, and means on the rear of the base for releasably locking the cover to the base, and secondly a socket for the watt-hour meter for receiving, and together with the transparent front cover, enclosing the meter base, said socket having receptacles therein receiving the contact blades protruding rearwardly through the base, said locking device being independent of any means associated with the installation and external of the socket for retaining the watt-hour meter in the socket, and comprising a locking member secured to one of the rear of the base and the interior of the socket so as to be enclosed within the socket, a releasable latch member normally in locking engagement with the locking member and secured to a second of the rear of the base and the interior of the socket so as to be enclosed within the socket, electrically operated actuator means housed within the socket, and mounted to one of the meter base and the socket, for releasing said latch member from locking engagement with the locking member, receiver means within the socket capable of receiving coded signals impressed on a carrier propagated from outside the meter installation, and means responsive to receipt of a specified coded signal by the receiver means for energizing said actuator means, whereby to release said latch member from said locking memeber to permit withdrawal of the meter from the socket after release of any means external of the socket for retaining the watt-hour meter in the socket.

2. A device according to claim 1, further including means sensing interruptions of power to the meter, and means counting such interruptions.

3. A device according to claim 1, further including means to sense and indicate separation of components secured by said locking means and latch member.

4. A device according to claim 1, wherein said actuator means is a solenoid.

5. A device according to claim 4, wherein the latch is spring biased into locking engagement with said locking member, and the solenoid is operative to overcome the spring bias when energized.

6. A device according to claim 1, wherein said actuator means is a reversible electric motor rotating an actuating screw linked to said latch member whereby to move the latter between positions engaged with and disengaged from said locking member.

7. A device according to claim 1, further including an auxiliary power supply operative to power said actuator on command during interruptions of supply to the meter.

8. A device according to claim 7, wherein said auxiliary power supply comprises a battery holder supported by the contact blades of the meter.

* * * * *